United States Patent
Mallikarjunaswamy (10) Patent No.: US 7,145,206 B2
(45) Date of Patent: Dec. 5, 2006

(54) MOS FIELD EFFECT TRANSISTOR WITH REDUCED PARASITIC SUBSTRATE CONDUCTION

(75) Inventor: Shekar Mallikarjunaswamy, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/938,311

(22) Filed: Sep. 9, 2004

(65) Prior Publication Data

US 2005/0029582 A1 Feb. 10, 2005

Related U.S. Application Data

(62) Division of application No. 10/315,479, filed on Dec. 9, 2002, now Pat. No. 6,815,800.

(51) Int. Cl.
*H01L 29/72* (2006.01)

(52) U.S. Cl. ............... 257/370; 257/273; 257/373; 257/401; 257/557; 257/565; 257/590

(58) Field of Classification Search ............... 257/565, 257/370, 273, 373, 401, 557, 590
See application file for complete search history.

(56) References Cited

U.S. PATENT DOCUMENTS

| | | | |
|---|---|---|---|
| 4,857,984 A * | 8/1989 | Lucas | 327/434 |
| 5,106,767 A | 4/1992 | Comfort et al. | |
| 5,117,271 A | 5/1992 | Comfort et al. | |
| 5,369,291 A | 11/1994 | Swanson | |
| 5,488,003 A | 1/1996 | Chambers et al. | |
| 5,869,873 A * | 2/1999 | Yu | 257/362 |
| 6,239,477 B1 | 5/2001 | Johnson | |
| 6,323,074 B1 * | 11/2001 | Jiang et al. | 438/202 |
| 6,365,932 B1 | 4/2002 | Kouno et al. | |
| 6,420,771 B1 | 7/2002 | Gregory | |
| 2002/0132435 A1 | 9/2002 | Zampardi et al. | |
| 2004/0262680 A1 * | 12/2004 | Ehwald et al. | 257/335 |

FOREIGN PATENT DOCUMENTS

| | | |
|---|---|---|
| EP | 1 119 036 A1 | 7/2001 |
| EP | 1 211 733 A1 | 6/2002 |
| JP | 58066356 | 4/1983 |

OTHER PUBLICATIONS

Kun-Zen Chang et al., "A Novel PHL-Emitter Bipolar Transistor—Fabrication and Characterization", Solid-State Electronics, vol. 36, No. 10, pp. 1393-1399, 1993.
European Search Report, 5 pages—Jun. 23, 2005.

* cited by examiner

*Primary Examiner*—Edward Wojciechowicz
(74) *Attorney, Agent, or Firm*—Patent Law Group LLP; Carmen C. Cook (57) ABSTRACT

A MOS field effect transistor includes an auxiliary diffusion formed in the drain region where the auxiliary diffusion has a conductivity type opposite to the drain region and is electrically shorted to the drain region. The auxiliary diffusion region forms a parasitic bipolar transistor having the effect of reducing substrate conduction caused by a forward biased drain to body junction.

8 Claims, 7 Drawing Sheets

MOS FIELD EFFECT TRANSISTOR WITH REDUCED PARASITIC SUBSTRATE CONDUCTION

CROSS REFERENCE TO RELATED APPLICATION

This application is a divisional of application Ser. No. 10/315,479, filed Dec. 9, 2002, now U.S. Pat. No. 6,815,800 entitled "Bipolar Junction Transistors with Reduced Parasitic Bipolar Conduction" of the same inventor hereof, which application is incorporated herein by reference in its entirety.

FIELD OF THE INVENTION

The invention relates to MOS Field Effect transistors and, in particular, relates to a method for manufacturing a MOS Field Effect transistor with reduced parasitic Substrate conduction.

DESCRIPTION OF THE RELATED ART

Figure 1:
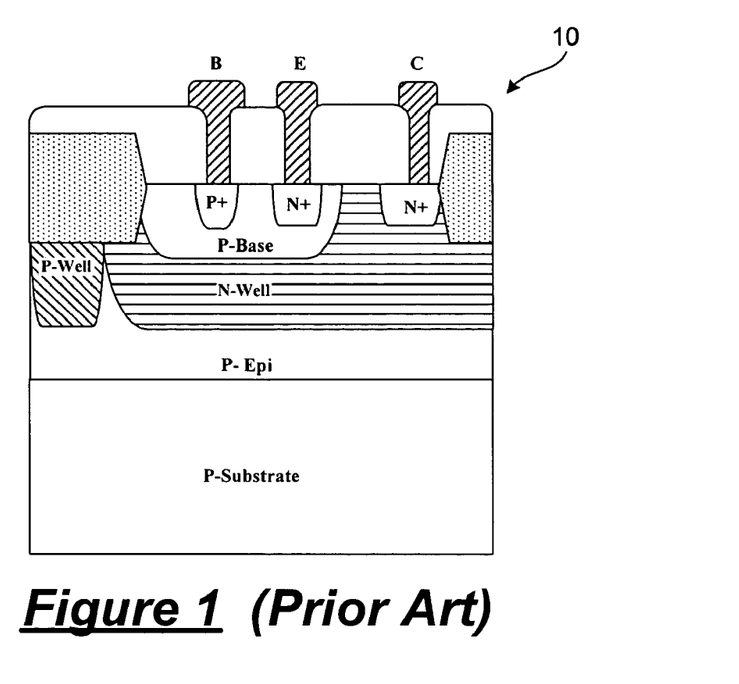
FIG. 1 illustrates a typical NPN bipolar transistor 10 built in a CMOS process.

When NPN and PNP bipolar transistors are integrated into CMOS, BiCMOS and BCD processes, an inherent parasitic bipolar transistor results. The parasitic bipolar transistor is formed by the base and the collector regions of the main bipolar device and the substrate on which the main bipolar device is built. FIG. 1 illustrates a typical NPN bipolar transistor 10 built in a CMOS process. The main bipolar device 10 includes an n+ region as the emitter, a p-type region as the base (P-Base) and an N-well formed in a p-type epitaxial layer as the collector. However, in such a transistor structure, a parasitic PNP bipolar transistor is also formed where the P-Base region functions as the emitter, the N-well functions as the base, and the p-type substrate functions as the collector.

The parasitic transistor formed along with the main bipolar device is undesirable for several reasons. Specifically, when the base to collector junction of the main bipolar device gets forward biased, such as during normal circuit operation or during an ESD event, the parasitic transistor can turn on and conducts a substantial amount of current. In fact, when the parasitic transistor is turned on, the transistor can inject high currents into the substrate, resulting in circuit malfunction or latch-up.

Figure 2:
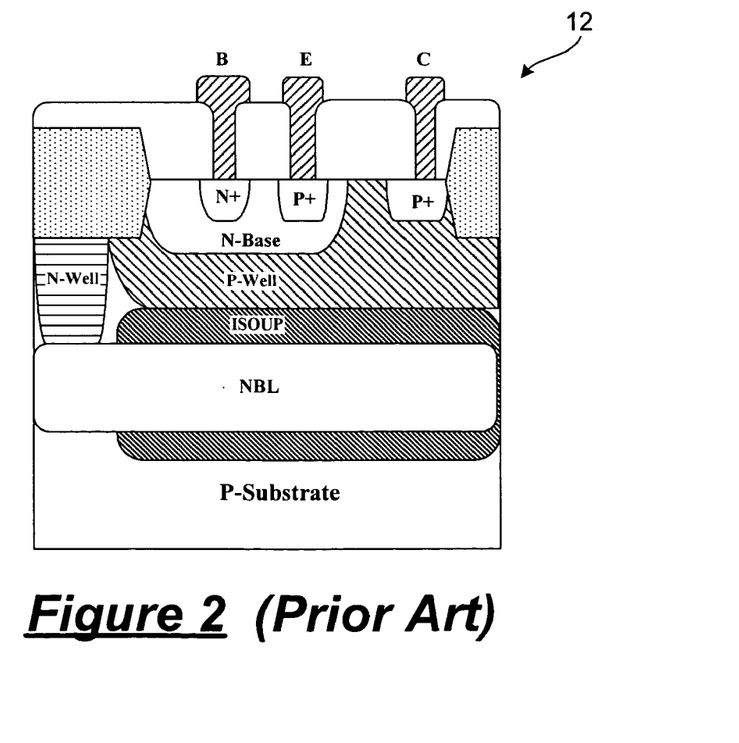
FIG. 2 illustrates a typical PNP bipolar transistor built in a BiCMOS process.

FIG. 2 illustrates a typical PNP bipolar transistor built in a BiCMOS process. PNP bipolar transistor 12 is formed by a p+ region as the emitter, an n-type region as the base (N-Base) and a P-Well as the collector. An N-type buried layer is included to isolate the PNP transistor from the substrate. As a result of forming PNP bipolar transistor 12 in a BiCMOS process, a parasitic NPN bipolar transistor is formed. The parasitic NPN bipolar transistor includes the N-Base region as the emitter, the P-Well as the base and the N-well isolation region or the N-type buried layer as the collector. The N-type buried layer will collect electrons injected from the N-base region as a result of parasitic conduction. Because the buried layer is generally connected to the power supply or to the emitter of PNP transistor 12, electron injection into the buried layer will increase the supply currents which is undesirable.

Conventional approaches to suppressing parasitic conduction include incorporating sinker structures to isolate the bipolar devices and thereby disabling the parasitic transistor. However, the use of sinker structures increases the size of the bipolar transistors and consequently increases the cost of the manufacturing process. Therefore, an improved method to suppress parasitic bipolar conduction in integrated bipolar junction transistors is desired.

SUMMARY OF THE INVENTION

According to one embodiment of the present invention, a MOS field effect transistor includes an auxiliary diffusion formed in the drain region where the auxiliary diffusion has a conductivity type opposite to the drain region and is electrically shorted to the drain region. The auxiliary diffusion region forms a parasitic bipolar transistor having the effect of reducing substrate conduction caused by a forward biased drain to body junction.

According to another aspect of the present invention, a bipolar transistor includes an auxiliary diffusion region formed in the base region having a conductivity type opposite to the base region and being electrically coupled to the base region. The auxiliary diffusion region forms a secondary parasitic transistor having the effect of suppressing parasitic bipolar conduction caused by a primary parasitic bipolar device associated with the bipolar transistor.

In one embodiment, a bipolar transistor device is formed on a semiconductor material of a first conductivity type and includes a base region, an emitter region and a collector region. The bipolar transistor device includes a first diffusion region formed in the base region and having a conductivity type opposite to the conductivity type of the base region. The first diffusion region being electrically coupled to the base region.

In one embodiment, the first diffusion region is formed using the same processing steps as the emitter diffusion and thus has the same doping profile and electrical characteristics as the emitter region.

Alternately, the auxiliary diffusion region can be incorporated in the collector region. Thus, according to another embodiment of the present invention, a bipolar transistor device is formed on a semiconductor material of a first conductivity type and includes a base region, an emitter region and a collector region. The bipolar transistor device includes a first diffusion region formed in the collector region and having a conductivity type opposite to the conductivity type of the collector region. The first diffusion region being electrically coupled to the collector region.

The present invention is better understood upon consideration of the detailed description below and the accompanying drawings.

DETAILED DESCRIPTION OF THE PREFERRED EMBODIMENTS

In accordance with the principles of the present invention, a bipolar transistor includes an auxiliary diffusion region formed in the base region where the auxiliary diffusion region has a conductivity type opposite to the base region and is electrically shorted to the base region. The auxiliary diffusion region forms a secondary parasitic transistor having the effect of suppressing parasitic bipolar conduction caused by a primary parasitic bipolar device associated with the bipolar transistor. Specifically, the auxiliary diffusion collects minority carriers injected in the base region of the bipolar transistor as a result of forward-biasing the base-collector junction of the bipolar transistor. Consequently, the secondary parasitic transistor reduces the emitter injection efficiency of the primary parasitic device and results in substantially lower substrate leakage current caused by parasitic bipolar conduction.

The bipolar transistor of the present invention incorporating an auxiliary diffusion region is useful when the bipolar transistor is integrated in a CMOS, BiCMOS, or BCD process where, by virtue of the integration, a companion parasitic bipolar device is formed as part of the main bipolar device. Incorporating the auxiliary diffusion region has the effect of forming a second parasitic bipolar device which functions to suppress the transistor action of the primary parasitic bipolar device. The following description illustrates exemplary embodiments of the bipolar transistor of the present invention where the bipolar transistor is incorporated in various CMOS and BiCMOS fabrication processes. The description below is illustrative only and one of ordinary skill in the art, after being apprised of the present invention, will appreciate that the bipolar transistor of the present invention incorporating an auxiliary diffusion region can be integrated in other CMOS, BiCMOS and BCD fabrication processes presently available or to be developed.

Figure 3:
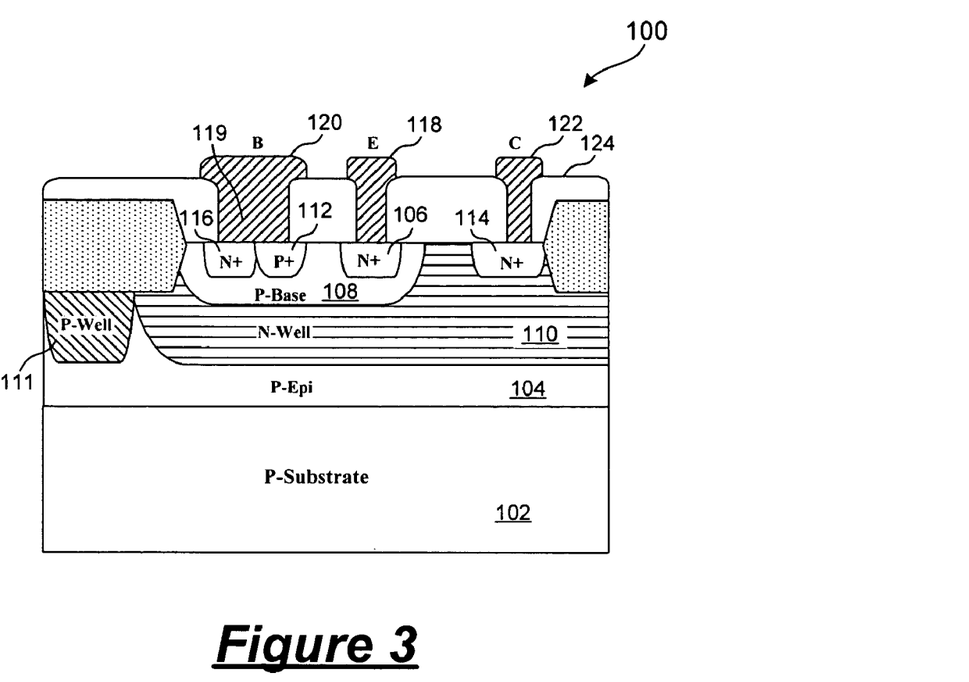
FIG. 3 is a cross-sectional view of an NPN bipolar transistor according to one embodiment of the present invention.
Figure 4:
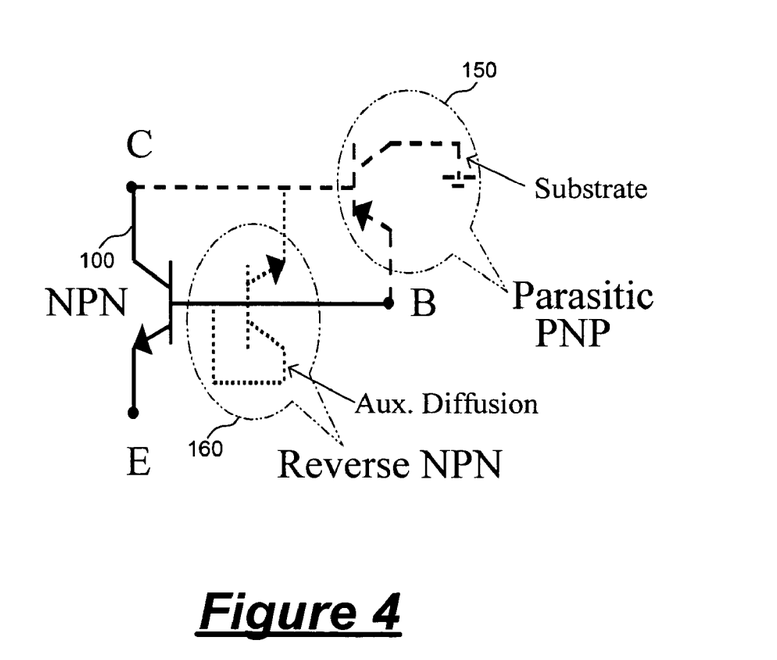
FIG. 4 illustrates the equivalent circuit of the bipolar transistor of FIG. 3.

FIG. 3 is a cross-sectional view of an NPN bipolar transistor according to one embodiment of the present invention. FIG. 4 illustrates the equivalent circuit of the bipolar transistor of FIG. 3. Referring to FIG. 3, NPN bipolar transistor 100 is integrated in a CMOS fabrication process. In the present embodiment, NPN bipolar transistor 100 is formed in a P-type epitaxial layer 104 formed on a p-type substrate (P-Substrate) 102. In general, a bipolar transistor is integrated in a CMOS process by adding a base diffusion in a well region of the opposite conductivity type. Thus, referring to FIG. 3, bipolar transistor 100 is formed by an n+ diffusion 106 as the emitter, a p-type diffusion (P-Base) 108 as the base, and an N-Well 110 as the collector.

An emitter terminal 118 is formed to provide electrical contact to an n+ emitter contact diffusion 106. Emitter terminal 118 is formed by providing a contact opening in a dielectric layer 124 and forming an electrode in the contact opening, such as by depositing and patterning a metal layer. A base terminal 120 for providing electrical contact to P-Base 108 is formed by forming a p+ base contact diffusion region 112 in P-Base 108 and forming a contact opening and an electrode electrically coupled to diffusion region 112. Similarly, a collector terminal 122 for providing electrical contact to N-Well 110 is formed by forming an n+ collector contact diffusion region 114 and forming a contact opening and an electrode electrically coupled to diffusion region 114.

By virtue of integrating NPN bipolar transistor 100 in a CMOS process and building the NPN bipolar transistor on a p-type substrate, a parasitic PNP bipolar transistor is formed alongside NPN bipolar transistor 100. In the present description, NPN bipolar transistor 100 will be referred to as the "main bipolar device" while the parasitic PNP bipolar transistor associated with the NPN bipolar transistor will be referred to as the "primary parasitic device." Referring to FIG. 3, the parasitic PNP bipolar transistor is formed between the base and the collector of the main bipolar device and the substrate on which NPN bipolar transistor 100 is built. Specifically, the parasitic PNP bipolar transistor is formed by P-Base 108 as the emitter, N-Well 110 as the base and P-Substrate 102 as the collector.

The equivalent circuit of the main bipolar device and the primary parasitic device is shown in FIG. 4. When the base to collector junction (that is, P-Base 108 to N-Well 110) of the main bipolar device becomes forward biased during normal circuit operations, the base to emitter junction of parasitic PNP bipolar transistor 150 is also forward biased, turning on the primary parasitic device. As a result of transistor action of the primary parasitic device, large currents are injected into P-Substrate 102. Large substrate currents are generally undesirable as they interfere with the normal operation of an integrated circuit. For instance, the large substrate currents can cause noise-sensitive analog circuits built on the same substrate as NPN bipolar transistor 100 to malfunction. In other cases, large substrate currents can cause the integrated circuit to enter latch-up, destroying the integrated circuit.

In accordance with the present invention, an auxiliary diffusion region is introduced in the base region of NPN bipolar transistor 100 for suppressing the parasitic bipolar conduction, thereby improving the performance of the integrated NPN bipolar transistor. The auxiliary diffusion region has a conductivity type opposite to the conductivity type of the base of the main bipolar device and is electrically shorted to the base. Referring to FIG. 3, an n+ diffusion region 116 is formed in P-Base 108 as the auxiliary diffusion region. In the present embodiment, n+ diffusion region 116 is formed adjacent to and abutting p+ diffusion 112 and is electrically shorted to P-Base 108 through the use of a butting contact 119 and the formation of a metal electrode electrically coupled to both n+ diffusion region 116 and p+ diffusion region 112.

The incorporation of n+ diffusion region 116 into the base of NPN bipolar transistor 100 has the effect of introducing a parasitic NPN bipolar transistor 160 in the main bipolar device. In the present description, the parasitic NPN bipolar transistor formed by the auxiliary diffusion region is referred to as the "secondary parasitic device." The secondary parasitic NPN bipolar device is formed by N-Well 110 as the emitter, P-Base 108 as the base and n+ diffusion region 116 as the collector. The equivalent circuit of the secondary parasitic device in relation to the main bipolar device and the primary parasitic device is illustrated in FIG. 4. The secondary parasitic device (parasitic NPN bipolar transistor 160) forms a "reverse" NPN transistor functioning to suppress the transistor action of the primary parasitic device (parasitic PNP bipolar transistor 150).

As described above, the base of the main bipolar device (P-Base 108) forms the emitter of the primary parasitic device. In accordance with the present invention, the secondary parasitic device formed by n+ diffusion region 116 suppresses parasitic conduction caused by the primary parasitic device by reducing the emitter efficiency of the primary parasitic device. In operation, when the P-Base to N-Well junction of the main bipolar device is forward biased in normal circuit operation, electrons injected from N-Well 110 into P-Base 108 are collected by n+ diffusion region 116 which has the effect of reducing the emitter injection efficiency of the primary parasitic device (PNP bipolar transistor 150). By reducing the emitter injection efficiency of the primary parasitic device, the current gain of the primary parasitic device is also reduced. Consequently, substrate currents caused by parasitic conduction of the primary parasitic device are also substantially reduced.

In one exemplary embodiment, when NPN bipolar transistor 100 is integrated in a 0.5 μm CMOS process, NPN bipolar transistor 100 can have a typical current gain of 50 while parasitic PNP bipolar transistor 150, without the auxiliary diffusion region, can have a current gain of 150. However, with the introduction of the auxiliary diffusion region in the base of NPN bipolar transistor 100, the current gain of parasitic PNP bipolar transistor 150 can be reduced to as low as 10. Thus, a substantial reduction in parasitic substrate current injection can be realized in the bipolar transistor of the present invention.

In the embodiment shown in FIG. 3, the auxiliary diffusion region (n+ diffusion region 116) is formed abutting the base contact diffusion region 112. Furthermore, a butting contact is used to electrically couple the two diffusion regions together. This arrangement is illustrative only and in other embodiments, the auxiliary diffusion region can be placed in proximity to the base contact diffusion region without actually abutting the base contact diffusion region. When the auxiliary diffusion region is not abutting the base contact diffusion region, the auxiliary diffusion region can be electrically shorted to the base contact diffusion region by means of an overlying conductive interconnect, such as a metal line.

In the present embodiment, the auxiliary diffusion region (n+ diffusion region 116) is formed using the same process steps for forming the emitter region (n+ diffusion 106). Furthermore, in the present embodiment, the design rules applicable to the emitter region are also applied to the auxiliary diffusion region. For example, the lateral spacing between the n+ diffusion to the P-Base diffusion for the emitter region is also applied to the spacing between the auxiliary diffusion region and the P-Base edge. Thus, the auxiliary diffusion region has the same dopant profiles and electrical characteristics as the emitter region.

The use of the emitter diffusion to form the auxiliary diffusion not only simplifies the process steps for forming NPN bipolar transistor 100 but also offers other advantages. Because the auxiliary diffusion region has the same dopant concentration, junction depth and lateral spacing as the emitter region, the auxiliary diffusion region will have similar breakdown characteristics as the emitter junction. Therefore, the introduction of the auxiliary diffusion region in bipolar transistor 100 will not impair the electrical characteristics of the main bipolar device.

In other embodiments, the auxiliary diffusion region in NPN bipolar transistor 100 of the present invention can be formed using other process steps in the fabrication process or using dedicated process steps. The basic requirement for the auxiliary diffusion region is that the introduction of the auxiliary diffusion region should not degrade the performance of the main bipolar device. For instance, the introduction of the auxiliary diffusion region should not lower the breakdown voltage of the main bipolar device. Therefore, the junction of the auxiliary diffusion should not be deeper than the base contact diffusion region. If the junction depth of the auxiliary diffusion region is too deep, the auxiliary diffusion may dominate and results in base to collector punch-through at voltages less than the punch-through voltage between the emitter to collector regions. In addition, the lateral spacing of the auxiliary diffusion region to the edge of the base region should be sufficient to avoid premature punch-through. In general, the lateral spacing between the auxiliary diffusion region and the edge of the base region should be at least the same as the spacing between the emitter region and the edge of the base region, thereby ensuring that the auxiliary region will not punch-through prior to the emitter region.

Figure 5A:
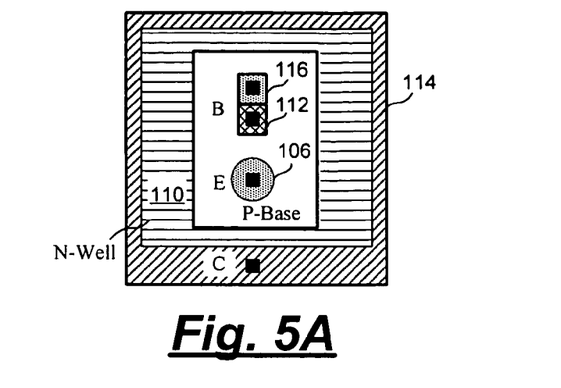
FIGS. 5A to 5C illustrate several layouts which can be used to construct the bipolar transistor of the present invention.
Figure 5B:
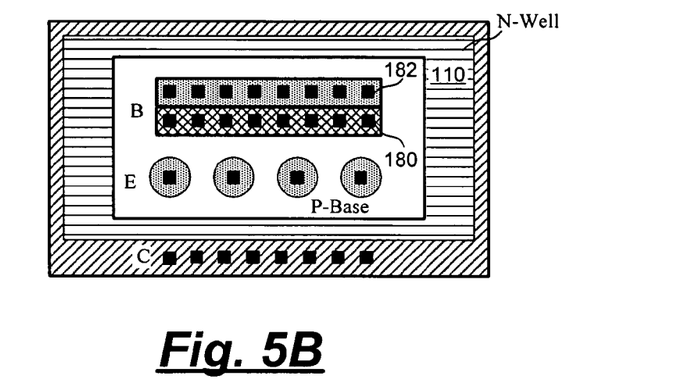
Figure 5C:
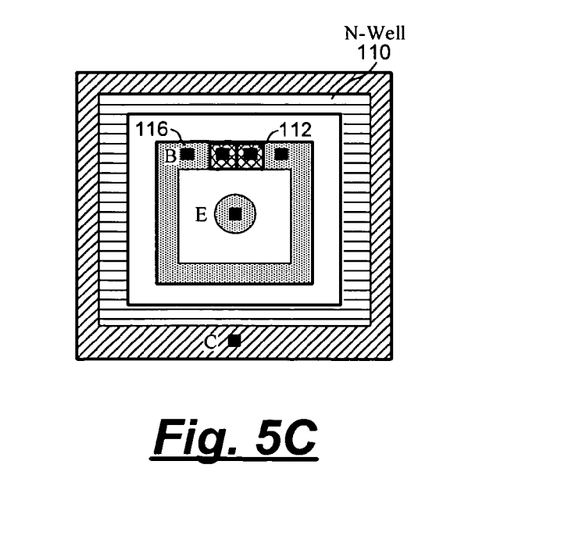

FIGS. 5A to 5C illustrate several layouts which can be used to construct the bipolar transistor of the present invention. The layout methods shown in FIGS. 5A to 5C demonstrate the various methods the auxiliary diffusion can be incorporated in an NPN bipolar transistor of the present invention while conserving silicon area. In general, the larger the area of the auxiliary diffusion region as compared to the P-Base to N-well junction, the better is the collection efficiency of secondary parasitic device. Therefore, it is generally desirable to make the area of the auxiliary diffusion as large as possible. However, introducing the auxiliary diffusion in the base region of the bipolar transistor also increases the base area of the main bipolar device and consequently increases the base to collector capacitance of the main bipolar device. Because increasing the collector to base capacitance may affect the high frequency operation of the main bipolar device, it is desirable to introduce the auxiliary diffusion region to the bipolar transistor without a substantial increase in total device area. That is, in most cases, it is desirable to introduce a sufficiently large auxiliary diffusion region with minimal increase in the surface area of the base region, thereby minimizing any increase in base to collector capacitance.

Referring to FIG. 5A, n+ diffusion region 116 is added adjacent and abutting p+ diffusion 112 which is the base contact diffusion region. As shown in FIG. 5A, n+ diffusion region 116 and p+ diffusion region 112 are provided with separate contacts. The two diffusion regions can be electrically shorted by using an overlaying metal layer. In other embodiments, a butting contact can be used for the adjacent n+ and p+ diffusion regions. Referring to FIG. 5B, when multiple base contacts 180 are used to connect to an elongated p+ diffusion region 112, a matching elongated n+ diffusion region 116 can be added alongside the p+ diffusion. Multiple contacts 182 can be provided to make electrical contact to the n+ diffusion region. Referring to FIG. 5C, in another embodiment of the bipolar transistor of the present invention, the n+ auxiliary diffusion region 116 is formed as a ring structure encircling the n+ emitter region. Contacts to the n+ ring structure can be placed in close proximity to p+ diffusion region 112 of the base region so that electrical connection can be made readily to electrically connect the n+ and p+ diffusion regions. FIGS. 5A to 5C illustrates exemplary layout of the bipolar transistor of the present invention and are not intended to be limiting. Of course, other layout arrangement can be used to incorporate the auxiliary diffusion region in a bipolar transistor to achieve minimal area increase while providing substantial reduction in substrate current. For example, in an alternate embodiment, multiple base contact diffusion regions and the auxiliary diffusion regions can be alternately placed in a single row.

The bipolar transistor of the present invention including an auxiliary diffusion region for suppressing parasitic conduction provides many advantages over conventional bipolar transistors. First, integrated circuits incorporating conventional bipolar transistors may experience difficulties at circuit start up due to excessive substrate leakage currents. During circuit start-up when the supply voltage is low, the bipolar transistor is biased in the saturation mode and the base to collector junction of the transistor is forward biased. In the conventional bipolar transistor, because the parasitic transistor is conducting and the base of the transistor is leaking currents into the substrate, the circuit in which the bipolar transistor is incorporated may not be able to start up. In accordance with the present invention, by suppressing parasitic conduction using an auxiliary diffusion region, integrated circuit incorporating the bipolar transistors of the present invention will not suffer from this type of circuit start-up problem.

Second, the bipolar transistor of the present invention can be applied for improving the ESD immunity of an integrated circuit. In some applications, such as in an differential amplifier, the base terminal of an NPN bipolar transistor is directly connected to the input pad of the integrated circuit for receiving an input voltage. In that case, when an ESD event occurs at the input pad and a positive ESD pulse is applied to the base terminal of the transistor, the base to collector junction of the bipolar transistor is forced to be forward biased. The parasitic PNP transistor is thus turned on and a large substrate current is caused to flow. The large substrate current often results in damages to the base-collector junction of the bipolar transistor. Prior art attempts at reducing the amount of substrate current in conventional bipolar transistors include increasing the base resistance. However, increased base resistance is undesirable as it often interferes with circuit performance. When the bipolar transistor of the present invention is incorporated in an integrated circuit, substrate currents due to an ESD event can be substantially reduced by the action of the auxiliary diffusion region forming the secondary parasitic transistor. Therefore, when the bipolar transistor of the present invention is incorporated in an integrated circuit, the ESD immunity of the integrated circuit can be accordingly improved.

Figure 6:
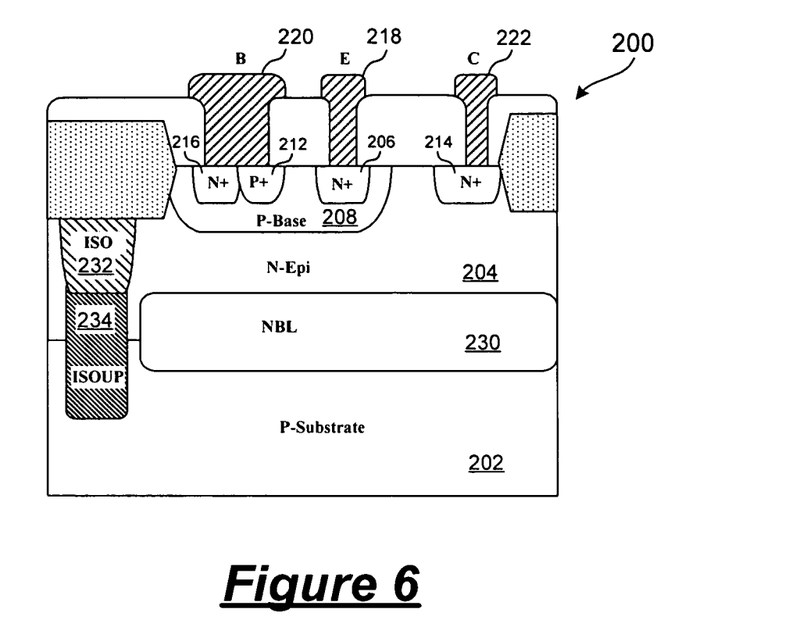
FIG. 6 illustrates an NPN bipolar transistor built using a BiCMOS fabrication process according to an alternate embodiment of the present invention.
Figure 7:
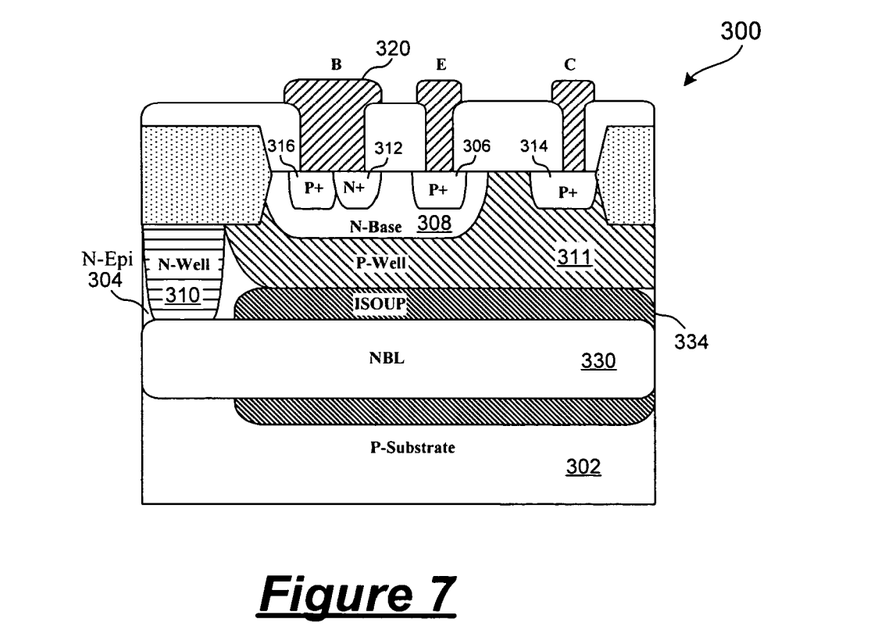
FIG. 7 illustrates a PNP bipolar transistor built using a BiCMOS fabrication process according to an alternate embodiment of the present invention.

FIGS. 6 and 7 illustrate an NPN and a PNP bipolar transistor, respectively, built using a BiCMOS fabrication process according to alternate embodiments of the present invention. Referring to FIG. 6, NPN bipolar transistor 200 is built in an n-type epitaxial layer 204 on a p-type substrate 202. An n-type buried layer 230 is formed on substrate 202 to isolate the bipolar transistor from the substrate. Bipolar transistor 200 is formed by an n+ diffusion region 206 as the emitter, a p-type diffusion region 208 (P-Base) as the base, and n-type epitaxial layer 204 (N-Epi) as the collector. Alternately, instead of forming the collector in the N-type epitaxial layer, the collector can be formed in an N-Well (not shown) formed in N-Epi 204.

Electrical contact to P-Base 208 is provided by a p+ base contact diffusion region 212. Electrical contact to the collector is provided by an n+ diffusion region 214. A base terminal 220 is provided for making electrical contact to P-Base 208. An emitter terminal 218 is provided for making electrical contact to emitter region 206. A collector terminal 222 is provided for making electrical contact to collection region 214. Bipolar transistor 200 includes an n+ diffusion region 216 formed in P-Base 208 as the auxiliary diffusion region. The auxiliary diffusion region forms a secondary NPN parasitic transistor between the n+ diffusion region 216, P-Base 208 and N-Epi 204. Although NPN bipolar transistor 200 includes a heavily doped n-type buried layer 204 which reduces the collector resistance and has the effect of reducing the substrate currents, the incorporation of the auxiliary diffusion region 216 forming a secondary parasitic transistor provides further reduction of the substrate currents, thereby yielding a more robust bipolar transistor. Furthermore, in cases where leakage current due to a forward biased base to collector junction of the main bipolar device does not flow vertically to buried layer 204 but rather flows laterally to the adjacent isolation diffusion region, such as p-type ISO region 232, auxiliary diffusion region 216 functions to collect the lateral leakage currents generated near the base to collector junction. In transistor 200, a p-type ISOUP diffusion region 234 is formed under p-type ISO region 232. Thus, the introduction of the auxiliary diffusion region in transistor 200 provides more effective parasitic conduction suppression than the use of a buried layer alone.

Referring to FIG. 7, PNP bipolar transistor 300 is constructed in an analogous manner as NPN bipolar transistor 200 with the polarities of the diffusion regions reversed. In the embodiment shown in FIG. 7, PNP bipolar transistor 300 is formed on an n-type epitaxial layer 304 on a p-type substrate 302. An n-type buried layer 330 is formed as part of the typical BiCMOS process. Where PNP transistors are to be formed, a p-type ISOUP diffusion region 334 is formed over buried layer 330 to isolate the PNP transistors from the substrate and to reduce the collector resistance. N-Well 310 is formed to isolate PNP transistor 300 from other devices formed on p-substrate 302. PNP bipolar transistor 300 is formed by a p+ diffusion region 306 as the emitter, an n-type diffusion region (N-Base) 308 as the base and a P-Well 311 as the collector. An n+ diffusion region 312 is provided in N-Base 308 as the base contact diffusion region and a p+ diffusion region 314 is provided in P-Well 311 as the collector contact diffusion region. PNP bipolar transistor 300 includes an auxiliary diffusion region formed in the base region having a conductivity type opposite to that of the base region. Thus, PNP bipolar transistor 300 includes a p-type diffusion region 316 formed in N-Base 308 as the auxiliary diffusion region. P-type diffusion region 316 is electrically shorted to N-Base 308 through base electrode 320 which is electrically coupled to p+ diffusion region 316 and base contact diffusion region 312. A secondary parasitic PNP transistor is formed having the effect of suppressing parasitic conduction caused by the primary parasitic NPN transistor associated with the main bipolar device 300.

In a typical BiCMOS process such as that used to form PNP transistor 300, the n-type buried layer is connected to the highest potential in the circuit, such as the power supply, or to the emitter terminal of the PNP bipolar transistor. Thus, when the base to collector junction of the PNP bipolar transistor is forward biased, the buried layer would collect electrons, resulting in a large supply current. The auxiliary diffusion region (p+ diffusion region 316) formed in N-Base 308 functions to collect the electrons generated at the forward biased base to collector junction of the main bipolar device 300. The auxiliary diffusion region has the effect of reducing the supply current that may otherwise flow in the buried layer and suppressing latch-up between N-Base 308 and p-substrate 302.

Figure 8:
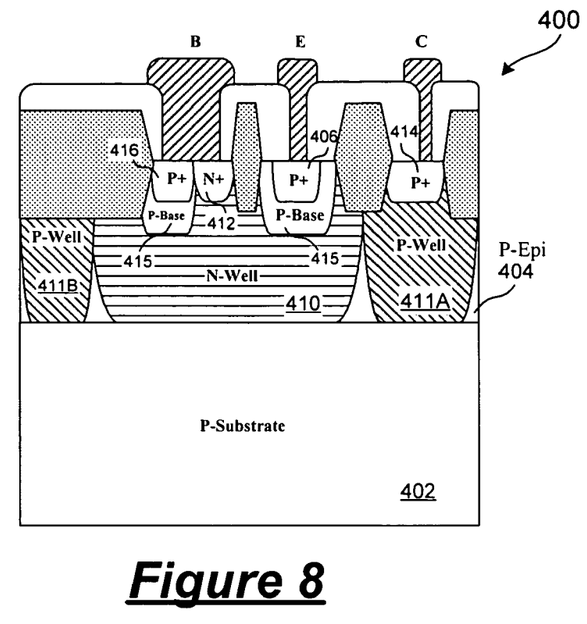
FIG. 8 illustrates a PNP bipolar transistor formed in a CMOS fabrication process according to another embodiment of the present invention.

FIG. 8 illustrates a PNP bipolar transistor formed in a CMOS fabrication process according to another embodiment of the present invention. In most CMOS processes, a bipolar option is typically available to form bipolar transistors using mainly regions that are available in the CMOS processes. In FIG. 8, a PNP bipolar transistor 400 is incorporated in a CMOS process where PNP bipolar transistor 400 is formed on a p-type epitaxial layer 404 on a p-type substrate 402. PNP bipolar transistor 400 includes a p+ diffusion 406 as the emitter, an N-Well 410 as the base and a P-Well 411A as the collector. Electrical contact to the base region (N-Well 410) of transistor 400 is formed by an n+ base contact diffusion region 412 and electrical contact to the collection region (P-Well 411A) of transistor 400 is formed by a p+ collector contact diffusion region 414. PNP bipolar transistor 400 includes p+ diffusion region 416 as the auxiliary diffusion region. The auxiliary diffusion region collects holes generated due to a forward biased base to collector junction of the main bipolar device and has the effect of suppressing substrate currents generated as a result of parasitic substrate conduction.

Note that in FIG. 8, a P-Well 411B is formed adjacent N-Well 410. P-Well 411B is formed as part of a conventional twin-well CMOS process where P-Wells and N-Wells are formed in a complementary manner in P-Epi 404. P-Well 411B is thus not an integral part of PNP bipolar transistor 400.

In the embodiment shown in FIG. 8, the CMOS process used for forming PNP bipolar transistor 400 includes an additional P-Base diffusion region 415 which can be used to form a deeper emitter junction. In the present embodiment, the auxiliary diffusion region 416 is formed using the same processing steps as the emitter region. Thus, auxiliary diffusion region 416 also includes a P-Base region 415 to form a deeper p-type junction in N-Well 410. The provision of a deeper p-type junction helps p-type diffusion 416 in collecting holes injected into N-Well 410 as a result of a forward biased base to collector junction (N-Well 410 to P-substrate 402) of the main bipolar device. Of course, in other embodiments, the emitter region of PNP bipolar transistor 400 may assume other structures, such as a single heavily doped p-type diffusion region. The use of a P-Deep region in the present embodiment is illustrative only.

Figure 9:
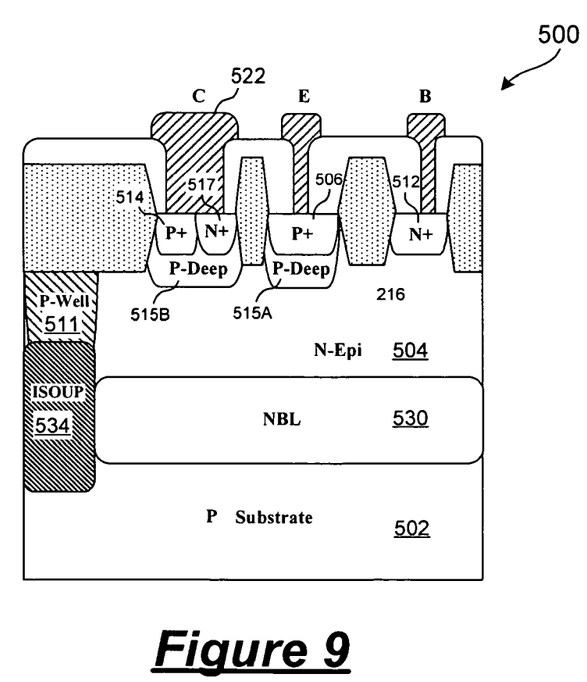
FIG. 9 illustrates a lateral PNP bipolar transistor formed in a BiCMOS fabrication process according to an alternate embodiment of the present invention.

FIG. 9 illustrates a lateral PNP bipolar transistor formed in a BiCMOS fabrication process according to an alternate embodiment of the present invention. FIG. 9 also illustrates another method of incorporating the auxiliary diffusion region in a bipolar transistor in accordance with the present invention. Referring to FIG. 9, PNP bipolar transistor 500 is formed in an n-type epitaxial layer 504 on a p-type substrate 502. An n-type buried layer 530 is formed on p-substrate 502 for isolation. P-well 511 and p-type ISOUP diffusion region 534 are also included to provide isolation of PNP bipolar transistor 500 from other devices on N-Epi 504. Lateral PNP transistor 500 includes a p+ diffusion region 506 and a p-type (P-Deep) diffusion region 515A as the emitter, N-Epi 504 as the base and a p-type diffusion (P-Deep) 515B as the collector. In the present embodiment, P-Deep diffusion 515A is formed under the emitter diffusion region 506 to provide a deeper emitter junction. Alternately, instead of forming the base in the N-type epitaxial layer, the base can be formed in an N-Well (not shown) formed in N-Epi 504.

In accordance with the present embodiment, the auxiliary diffusion region is introduced at the collector of the main bipolar device. Thus, the auxiliary diffusion region has a conductivity opposite to that of the collector of the main bipolar device and is electrically connected to the collector. In the present embodiment, the auxiliary diffusion region is an n+ diffusion region 517 formed in P-Deep region 515B and adjacent a collector contact diffusion region 514. Furthermore, in the present embodiment, n+ diffusion region 517 is formed using the same processing steps as n+ base contact diffusion region 512. Thus, n+ diffusion region 517 has the same doping profiles and electrical characteristics as the base contact diffusion region of PNP transistor 500. In other embodiments, n+ auxiliary diffusion region 517 may be formed using dedicated processing steps or using processing steps for forming other diffusion regions on substrate 502 other than the n+ base contact diffusion region.

For the secondary parasitic bipolar device to be most effective, the auxiliary diffusion region should be placed as near the base to collector junction of the main bipolar device as possible. In the above embodiments, the auxiliary diffusion region can be placed in the base region and be in close proximity to the base to collector junction of the main bipolar device. However, in some transistor structures, such as the lateral PNP transistor in FIG. 9, placing the auxiliary diffusion region in the collector actually brings the auxiliary diffusion region closer to the base-collector junction of the main bipolar device. Therefore, the embodiment shown in FIG. 9 provides advantages in that the secondary parasitic bipolar transistor formed by introducing auxiliary diffusion region 517 is made more effective in suppressing parasitic conduction. Of course, care should be taken to inhibit parasitic SCR action which may occur with the introduction of n+ diffusion region 517 in P-Deep region 515B.

The above description illustrates bipolar transistors of the present invention fabricated using various types of CMOS or BiCMOS fabrication processes and illustrates how the auxiliary diffusion region can be incorporated in the various bipolar transistors. Of course, the above description is illustrative only. The transistor and method of the present invention can be applied to form bipolar transistor fabricated using any fabrication processes and are not limited to the CMOS and BiCMOS processes described above. For instance, the structure and method of the present invention can be applied to form a bipolar transistor in a SiGe BiCMOS process using an emitter poly structure. In one embodiment, the auxiliary diffusion region can be formed as an additional emitter poly region where the additional emitter poly region is shorted to the base of the main bipolar device, as shown in FIG. 10 and described below.

Figure 10:
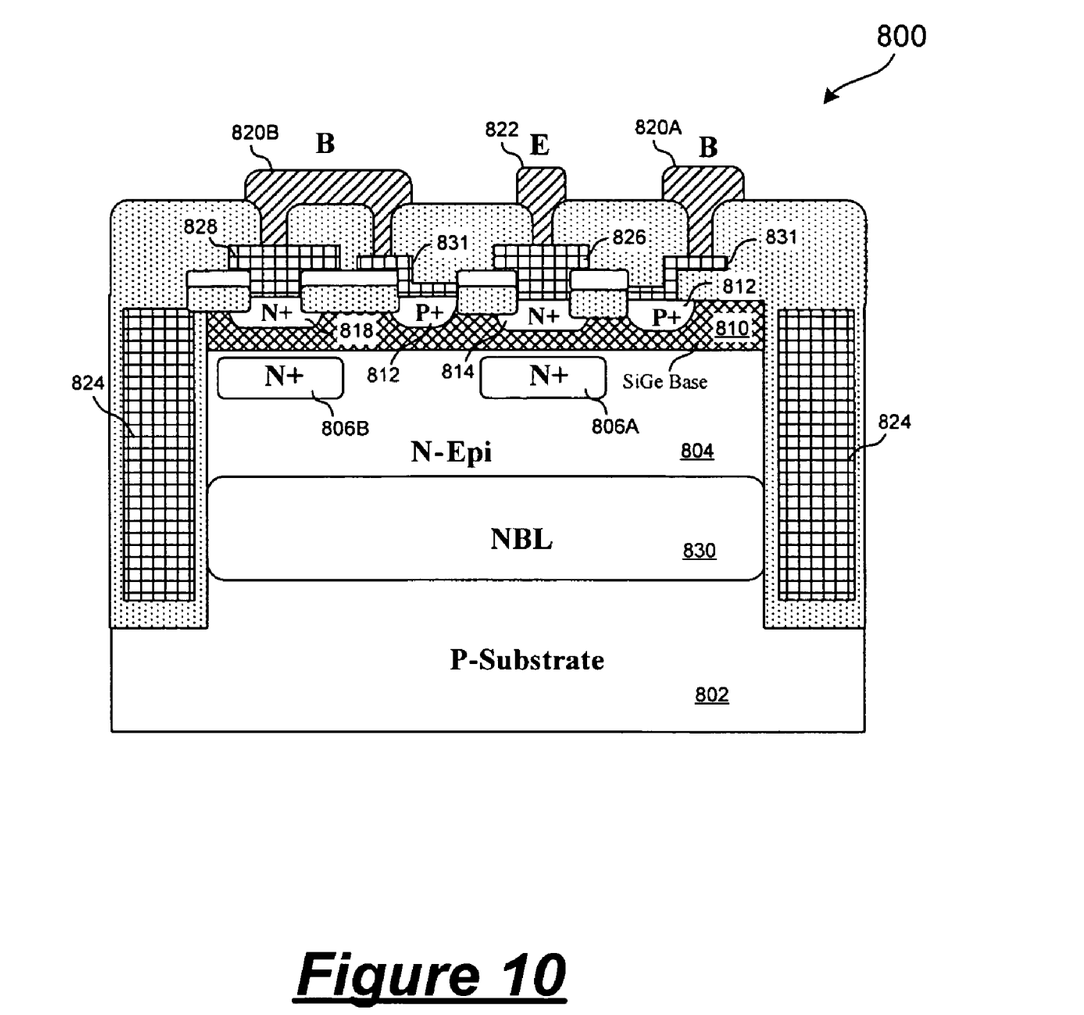
FIG. 10 is a cross-sectional view of a SiGe heterojunction bipolar transistor according to one embodiment of the present invention.

FIG. 10 is a cross-sectional view of a SiGe heterojunction bipolar transistor (HBT) fabricated using a SiGe BiCMOS process according to one embodiment of the present invention. Referring to FIG. 10, SiGe HBT 800 is built on a p-type substrate 802 including an n-type buried layer 830 and on which an n-type epitaxial layer 804 is formed. N-Epi 804 forms the collector terminal of SiGe HBT 800. A SiGe layer 810, grown using conventional epitaxial techniques, forms the base region of SiGe HBT 800. A base contact diffusion, p+ diffusion 812, is provided to electrically couple SiGe layer 810 to a base terminal 820A. In the present illustration, a polysilicon layer 831 is used to connect p+ diffusion 812 to metal terminal 820A. The emitter region of HBT 800 is formed by an n+ diffusion region 814 formed in SiGe layer 810 and a polysilicon layer 826. In one embodiment, n+ diffusion region 814 is formed by the out-diffusion of n-type dopants from polysilicon layer 826. A Kirk implant region 806A is formed in N-Epi 804 just under the emitter region and operates to inhibit base push-out effect. A trench isolation structure 824 is included to isolate HBT 800 from other structures on P-Substrate 802.

In accordance with the present invention, an auxiliary diffusion region is introduced to SiGe HBT 800 by forming another emitter structure and electrically shorting the emitter structure to the base terminal. Referring to FIG. 10, the auxiliary diffusion region is formed by an n+ diffusion region 818 and a polysilicon layer 828. The auxiliary diffusion region is electrically shorted to base contact diffusion region 812 through a metal interconnect 820B. In the present embodiment, because the auxiliary diffusion region is formed using the same processing steps as the emitter region, a Kirk implant region 806B is also formed in N-Epi 804 under n+ diffusion region 818. As thus formed, SiGe HBT 800 includes a secondary parasitic bipolar transistor having the effect of suppressing parasitic conduction in the main bipolar transistor.

In another embodiment, the method and structure of the present invention can be applied to a bipolar transistor formed using trench bipolar technologies. In trench bipolar technologies, an additional emitter diffusion region can be added to the base region to form the auxiliary diffusion region.

According to another aspect of the present invention, a MOS field effect transistor includes an auxiliary diffusion formed in the drain region where the auxiliary diffusion has a conductivity type opposite to the drain region and is electrically shorted to the drain region. The auxiliary diffusion region forms a parasitic bipolar transistor having the effect of reducing substrate conduction caused by a forward biased drain to body junction.

Figure 11:
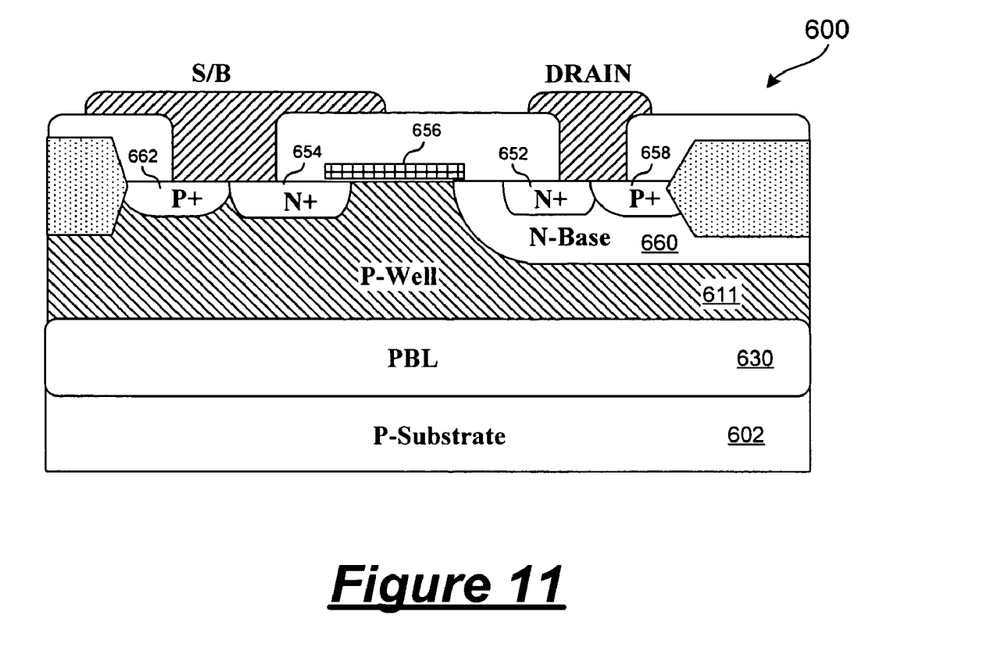
FIG. 11 is a cross-sectional view of an NMOS transistor according to one embodiment of the present invention.

FIG. 11 is a cross-sectional view of an NMOS transistor according to one embodiment of the present invention. Referring to FIG. 11, NMOS transistor 600 in fabricated using a BiCMOS process and is constructed to withstand high voltages (such as 20–30 volts). NMOS transistor 600 is built on a p-type substrate 602. A p-type buried layer 630 is formed on substrate 602. Subsequently an epitaxial layer is formed on substrate 602 in which transistor 600 is formed. Transistor 600 is formed in a P-well 611. A p+ diffusion 662 is provided to electrically bias the P-well. In the present embodiment, the P-well is electrically shorted to the source terminal of the transistor. An n+ diffusion region 654 formed in P-well 611 functions as the source terminal. Another n+ diffusion region 652 formed in an N-base diffusion region 660 functions as the drain terminal. A polysilicon layer 656 forms the gate terminal of the transistor. In the present embodiment, because NMOS transistor 600 is a high voltage transistor, the drain terminal of the transistor is formed using an n+ diffusion region in an N-base diffusion region. N-base diffusion region 660 has a higher dopant concentration than P-well 611 and increases the breakdown voltage at the drain terminal of the transistor.

In accordance with the present invention, an auxiliary diffusion region is introduced in the drain region of NMOS transistor 600 for suppressing parasitic conduction at the drain terminal. Specifically, when the drain to body (p-well 611) junction becomes forward biased, electron injection into the substrate occurs causing high substrate current. Drain to body conduction in a MOS transistor can occur when the MOS transistor is used to drive inductive loads. In the present embodiment, transistor 600 includes a p+ diffusion region 658 in the drain region as an auxiliary diffusion region. P+ diffusion region 658 is electrically coupled to n+ diffusion region 652 forming the drain terminal. The auxiliary diffusion region forms a parasitic bipolar transistor and has the effect of collecting holes injected from P-well 611 into the drain region due to a forward biased n+ to p-well junction. Thus, the inclusion of p+ diffusion region 658 in the drain terminal of NMOS transistor 600 improves the performance of the transistor by reducing substrate leakage currents.

In the present embodiment, p+ diffusion region 658 is formed using the same processing steps for forming p+ diffusion 662. In other embodiments, p+ diffusion region 658 can be formed using dedicated processing steps.

Figure 12:
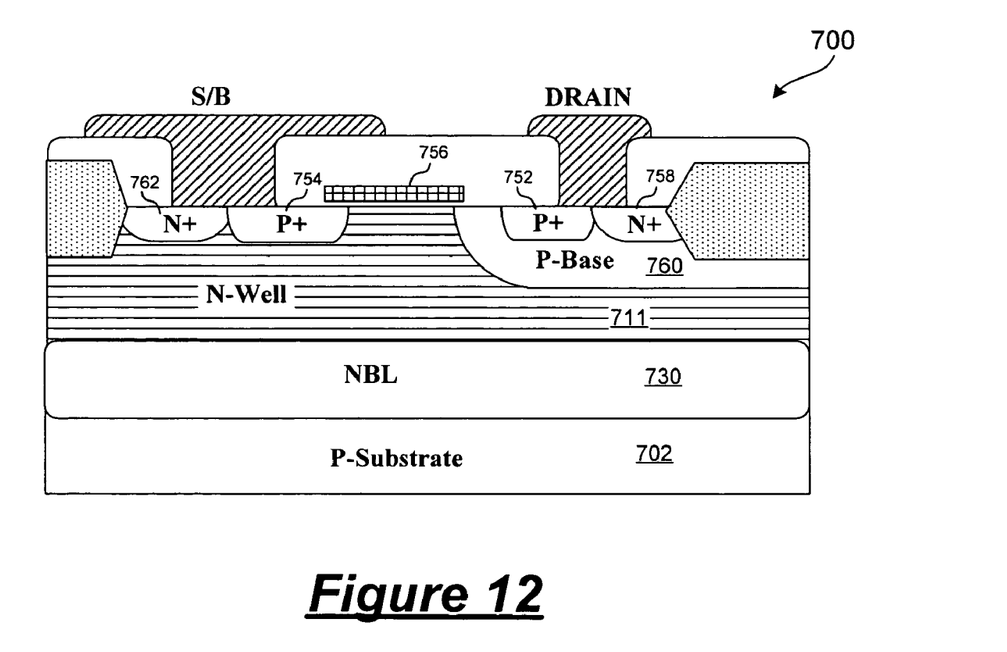
FIG. 12 is a cross-sectional view of a PMOS transistor according to one embodiment of the present invention.

The auxiliary diffusion region can also be incorporated in a PMOS transistor. FIG. 12 is a cross-sectional view of a PMOS transistor according to one embodiment of the present invention. Referring to FIG. 12, PMOS transistor 700 is fabricated using a BiCMOS process. Construction of PMOS transistor 700 is similar to NMOS transistor 600 with the polarities of the diffusion regions reversed. PMOS transistor 700 is built in an N-well 711 formed in an epitaxial layer on a p-type substrate 702. An n-type buried layer 730 is formed on the substrate surface for reducing the well resistance. PMOS transistor 700 includes a p+ diffusion region 754 as the source terminal, a polysilicon gate 756 as the gate terminal, and another p+ diffusion region 752 formed in a P-base diffusion region 760 as the drain terminal. An n+ diffusion region 762 is provided to bias N-well 711. In the present embodiment, N-well 711 is electrically connected to the source terminal of the transistor. PMOS transistor 700 further includes an n+ diffusion region 758 in the drain region as the auxiliary diffusion region.

When the drain (p+ diffusion region 752) to the body (N-well 711) junction of PMOS transistor 700 is forward biased, holes injection from the drain region into the body occurs, causing substrate leakage current to flow. By incorporating n+ diffusion region 758 in the drain region of PMOS transistor 700, a parasitic bipolar transistor is formed having the effect of collecting electron injection from the N-well and thereby reducing the substrate leakage current.

The above detailed descriptions are provided to illustrate specific embodiments of the present invention and are not intended to be limiting. Numerous modifications and variations within the scope of the present invention are possible. For example, in the above description, a base contact diffusion region is included in the bipolar transistors for providing a low resistance electrical contact to the base region. The use of a base contact diffusion region is illustrative only and in other embodiments, other means for making electrical contact to the base region may be used. The present invention is defined by the appended claims.

I claim:

1. A MOS field effect transistor device formed in a well of a first conductivity type where the well is formed in a semiconductor substrate and comprising a source region and a drain region, both of a second conductivity type, spaced apart by a gate dielectric and a gate conductor, the MOS field effect transistor further comprising:

a first diffusion region formed in the drain region and having the first conductivity type opposite to the second conductivity type of the drain region, the first diffusion region being electrically shorted to the drain region; and a well contact diffusion region of the first conductivity type formed in the well, the well contact diffusion region being more heavily doped than the well, and wherein the first diffusion region has a dopant type, a dopant concentration and a junction depth that are the same as the well contact diffusion region, wherein the drain region comprises a second diffusion region of the second conductivity type formed in a third diffusion region of the second conductivity type, the second diffusion region being more heavily doped than the third diffusion region, and wherein the first diffusion region is formed in the third diffusion region.

2. The MOS field effect transistor device of claim 1 wherein the first diffusion region is formed adjacent to the second diffusion region.

3. The MOS field effect transistor device of claim 1 wherein the first diffusion region is formed abutting to the second diffusion region.

4. The MOS field effect transistor device of claim 1 wherein the MOS field effect transistor device is fabricated using a BiCMOS process and the third region is a base diffusion region of the second conductivity type.

5. The MOS field effect transistor device of claim 1, wherein the first diffusion region is formed using the same processing steps for forming the well contact diffusion region.

6. The MOS field effect transistor device of claim 1, wherein the first conductivity type is n-type and the second conductivity type is p-type.

7. The MOS field effect transistor device of claim 1, wherein the first conductivity type is p-type and the second conductivity type is n-type.

8. The MOS field effect transistor device of claim 1, wherein the well is formed in an expitaxial layer formed on a semiconductor substrate.

* * * * *